United States Patent
Frees et al.

(10) Patent No.: US 6,740,195 B2
(45) Date of Patent: May 25, 2004

(54) DETECTION OF NONTRANSIENT PROCESSING ANOMALIES IN VACUUM MANUFACTURING PROCESS

(75) Inventors: Louis C. Frees, Manlius, NY (US); Valentin Rio, Austin, TX (US)

(73) Assignee: Leybold Inficon, Inc., East Syracuse, NY (US)

( * ) Notice: Subject to any disclaimer, the term of this patent is extended or adjusted under 35 U.S.C. 154(b) by 0 days.

(21) Appl. No.: 10/231,536

(22) Filed: Aug. 30, 2002

(65) Prior Publication Data

US 2003/0008422 A1 Jan. 9, 2003

Related U.S. Application Data

(62) Division of application No. 09/358,067, filed on Jul. 21, 1999, now Pat. No. 6,468,814.
(60) Provisional application No. 60/093,960, filed on Jul. 24, 1998.

(51) Int. Cl.[7] .................................................. C23F 1/00
(52) U.S. Cl. ........................ 156/345.24; 156/345.31; 156/345.32; 204/298.03; 204/298.25; 204/298.32; 204/298.35; 118/663; 118/670; 118/679; 118/696; 118/699; 118/703; 118/707; 118/708; 118/712; 118/715; 118/719
(58) Field of Search ................................ 118/663, 670, 118/679, 696, 699, 703, 707, 708, 712, 713, 715, 719; 166/345.24, 345.26, 345.31, 345.32; 204/298.03, 298.25, 298.32, 298.35

(56) References Cited

U.S. PATENT DOCUMENTS

| | | | | |
|---|---|---|---|---|
| 4,170,751 A | * | 10/1979 | Stricker | 318/563 |
| 4,390,869 A | * | 6/1983 | Christen et al. | 340/632 |
| 4,428,811 A | * | 1/1984 | Sproul et al. | 204/192.13 |
| 4,470,298 A | * | 9/1984 | Jibelian | 73/23.42 |
| 5,142,143 A | | 8/1992 | Fite et al. | 250/288 |
| 5,199,994 A | * | 4/1993 | Aoki | 118/724 |
| 5,409,540 A | * | 4/1995 | Mifune | 118/719 |
| 5,413,940 A | | 5/1995 | Lin et al. | 437/7 |
| 5,540,946 A | * | 7/1996 | DeVries et al. | 427/8 |
| 5,700,127 A | * | 12/1997 | Harada et al. | 414/416.08 |
| 5,795,399 A | | 8/1998 | Hasegawa et al. | 134/1.3 |
| 5,821,175 A | | 10/1998 | Engelsberg | 438/795 |
| 5,999,886 A | * | 12/1999 | Martin et al. | 702/31 |
| 6,091,068 A | * | 7/2000 | Parfitt et al. | 250/292 |
| 6,146,492 A | * | 11/2000 | Cho et al. | 156/345.24 |
| 6,468,814 B1 | * | 10/2002 | Frees et al. | 438/14 |
| 2003/0008422 A1 | * | 1/2003 | Frees et al. | 438/14 |

OTHER PUBLICATIONS

Leybold Inficon, Inc. "TRANSPECTOR® Gas Analysis System" Manual (Mar. 1997).

* cited by examiner

*Primary Examiner*—Jeffrie R. Lund
(74) *Attorney, Agent, or Firm*—Wall Marjama & Bilinski LLP

(57) ABSTRACT

A sensor, such as a mass spectrometer, capable of detecting the presence of materials in a sampled gas is interconnected with a processing chamber of a vacuum manufacturing tool. The sensor includes a timing circuit which is activated only if certain levels of specific materials are detected. Furthermore, the timer is set to run a predetermined time interval after activation so as to discriminate between known transient processing conditions and the presence of impurities which can greatly influence the manufacturing process. When the timer exceeds the predetermined time duration, an output signal can alert the process operator or automatically shutdown the manufacturing tool.

13 Claims, 7 Drawing Sheets

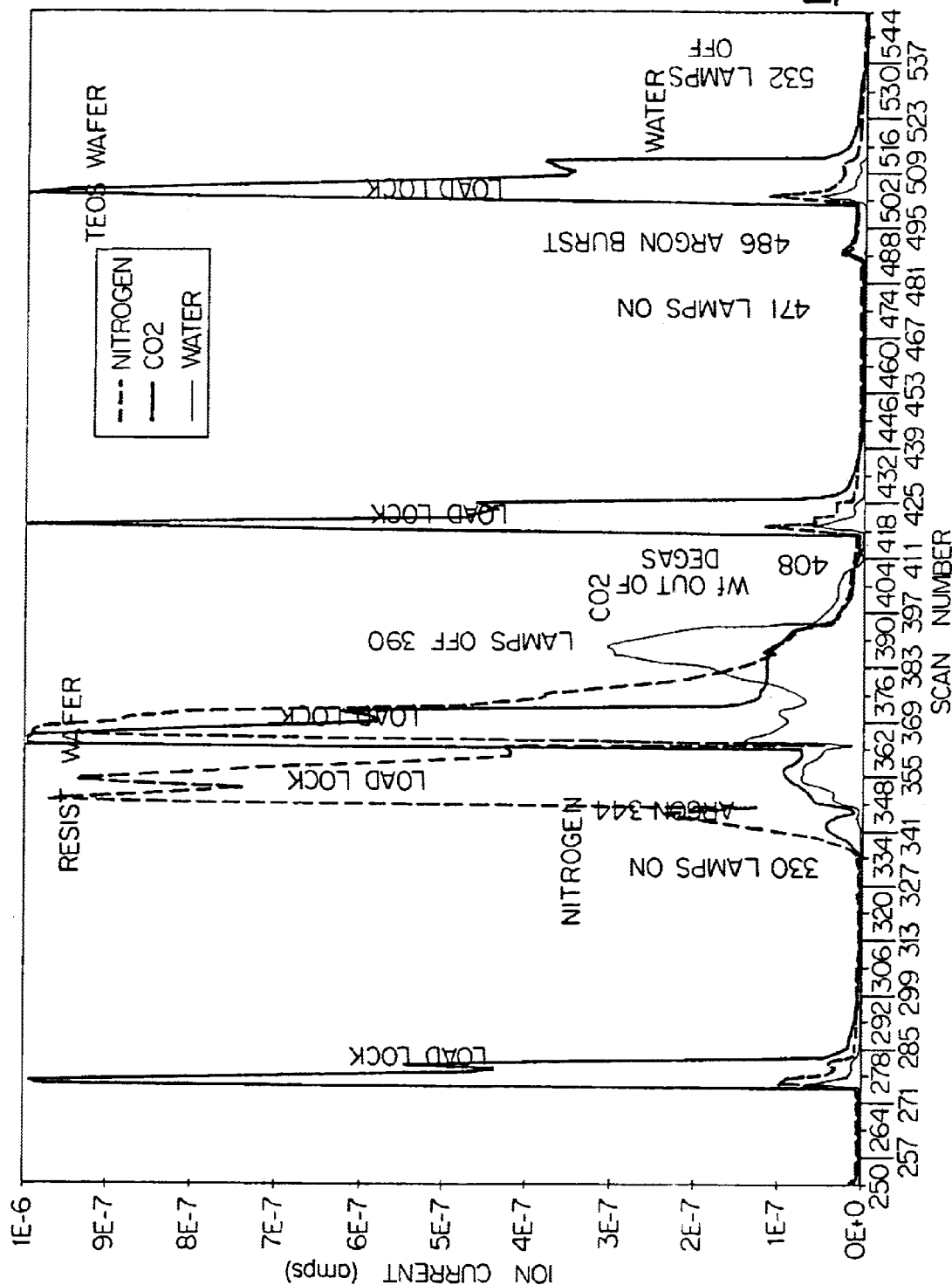

DETECTION OF NONTRANSIENT PROCESSING ANOMALIES IN VACUUM MANUFACTURING PROCESS

CROSS REFERENCE TO RELATED APPLICATION

This is a divisional application of U.S. Ser. Nos. 60/093,960 and 09/358,067, filed Jul. 24, 1998 and Jul. 21, 1999 now U.S. Pat. No. 6,468,814, respectively, the entirety of which is incorporated herein by reference.

FIELD OF THE INVENTION

The invention relates to the field of semiconductor wafer processing, and in particular to utilization of a mass spectrometer or similar sensor in conjunction with manufacturing or processing apparatus for detection of aberrant conditions, such as the presence of certain contaminants on a semiconductor substrate.

BACKGROUND OF THE INVENTION

Many manufacturing processes which occur in a vacuum or other controlled atmosphere are sensitive to levels of one or more contaminants, process by-products, or other substances present in a process chamber(s).

In the field of semiconductor substrate manufacturing, PVD (Physical Vapor Deposition) metallization cluster tools require a complex vacuum system to ensure low partial pressures of water, oxygen, nitrogen and hydrocarbons. These compounds act as contaminants which degrade the quality of different metal films deposited by sputtering. Therefore, the presence of these compounds must be continuously monitored to safeguard process quality.

Residual photoresist present on a semiconductor (e.g., silicon) wafer which is about to undergo sputter deposition of metal (e.g., aluminum) interconnects is a typical example of such an undesirable contaminant in a semiconductor manufacturing process. If the photoresist-contaminated wafer reaches the sputter module, and the deposition process is initiated, then the sputter module will be severely contaminated by the photoresist. The wafer being processed will be irreparably damaged, and the sputter module will have to be cleaned before further wafers can be processed. The process of cleaning a sputter module is both time consuming and expensive.

Current semiconductor sputtering tools generally employ a separate process chamber wherein the wafer, after it is inserted into the overall manufacturing tool, can be degassed before further processing. In this chamber, the wafer is rapidly heated to drive off normally adsorbed contaminants such as water vapor. The degas module removes water by heating the wafer either with tungsten/halogen lamps while under vacuum, or by placing the wafer on a heated chuck while argon flows on the back side of the wafer. If the wafer is also contaminated with residual photoresist, gases characteristic of the specific type of photoresist present will be desorbed from the wafer. When small amounts of photoresist remain on the wafer, the above degas step will cause pyrolysis of the photoresist which breaks the large polymer molecules into several certain gaseous compounds.

It is known that the presence of gases can be determined in a sampled gas environment using a mass spectrometer, such as those manufactured and sold by Leybold Inficon, Inc. of East Syracuse, N.Y. The presence of gases is determined by use of partial pressures of the environment and the gas(es) in question. Using a mass spectrometer, it is possible to monitor the levels of these characteristic gases by measuring the signal intensities of the appropriate mass-to-charge ratios of ions produced by these substances. If the signals at these masses exceed some predetermined upper limit during the degas process, it can be concluded that excessive amounts of photoresist are present.

Though ordinarily, it would seem likely to perform such a measurement, it is also known that modern semiconductor processing tools have been developed which allow simultaneous processes to be occurring in various chambers connected to the tool. Therefore, and when a wafer is transferred from one of these other modules (chambers) to the wafer handling chamber to which the degas module is attached, a pressure burst may occur in the degas module. This pressure burst can cause erroneously high levels of the masses being monitored by the mass spectrometer. It has been determined, however, that the duration of the signals produced by pressure bursts extend over a period of time which is significantly shorter than that of the degas process itself.

There is a need to provide a detector which is able to measure with certainty the small amounts of compounds which are produced when residual photoresist undergoes pyrolysis at the degas module, in order for the process to be halted, so as to prevent further contamination of PVD modules, and the extensive downtime required to clean the modules.

SUMMARY OF THE INVENTION

It is an object of the present invention to improve the state of the art of semiconductor manufacturing processes.

It is a further object of the present invention to detect the presence of impurities on a semiconductor wafer prior to high level vacuum processing so as to prevent downtime of a manufacturing tool.

It is yet a further object of the present invention to integrate the detection of impurities into the processing protocol either to allow automatic shutdown of the tool, or at a minimum, to notify the operator of a contamination condition.

Therefore and according to a preferred aspect of the present invention, there is provided a processing apparatus for determining the presence of aberrant conditions in a manufacturing process, said apparatus comprising:

a manufacturing tool having an interior within which said manufacturing process is performed and control means for controlling said manufacturing process; and a sensor in communication with the interior of said manufacturing tool, said sensor having means for determining mass constituents of at least one sampled gas created during said manufacturing process and producing signals indicative of the intensities of said constituents, said sensor further including means for detecting when signals produced by said sensor has exceeded a predetermined value.

Preferably, the detecting means includes a timing circuit which allows the sensor, preferably a mass spectrometer, to distinguish the presence of signals which are characteristic of transient processing characteristics in comparison to longer signals that are representative of an acute processing problem, such as the presence of certain impurities. According to a preferred technique, an algebraic Boolean expression, using AND and OR logic, can be created to initiate the timing circuit only if certain binary conditions (e.g., meeting a predetermined ion current limit) are met.

Using similar logic, other processing conditions having output variables capable of being converted into binary values can also be monitored. The presence of such conditions, as evaluated through the above Boolean logic, can produce a signal which can be directly input to the manufacturing tool to terminate the process automatically or at a minimum to alert an operator thereof.

According to another preferred aspect of the invention, there is provided a processing apparatus for determining the presence of nontransient conditions in a semiconductor substrate manufacturing process, said apparatus comprising:

a manufacturing tool having an interior including a plurality of chambers within which said semiconductor substrate manufacturing process is performed and control means for controlling said manufacturing process; and at least one sensor in communication with the interior of said manufacturing tool, said sensor being a mass spectrometer having means for determining mass constituents of at least one sampled gas created during said manufacturing process and producing representative signals indicative thereof, said sensor further including means for detecting signals produced by said sensor which have exceeded a predetermined value including a timer which is activated only upon detection of signals exceeding the predetermined value.

Preferably, the timer includes means for sending an output signal to said manufacturing tool if said timer exceeds a predetermined duration and is connected to said control means to cause termination of the manufacturing process automatically.

The sensor is preferably a mass spectrometer having means for producing and detecting ions having specified mass to charge ratios, said detecting means being capable of detecting representative signals of said specified ions, said sensor further including a plurality of relays, each relay having at least one setpoint which is triggered when at least one specified ion signal has exceeded a predetermined intensity.

According to the invention, the triggering of setpoints of certain preselected relays produces an output signal which is transmitted to said timing circuit for activating said timer. The time duration of said timer is selected to be greater than the known time duration of transient processing effects produced within the manufacturing tool such that the output signal generated by said timing circuit effectively screens the transient processing effects.

According to yet another preferred aspect of the invention, there is provided a method for determining the presence of nontransient processing conditions in a manufacturing process, said method including the steps of:

sampling specified mass constituents of at least one gas present within the interior of a manufacturing tool used in said manufacturing process;

activating a timer only if predetermined levels of certain mass constituents of said at least one gas are exceeded, said timer being set to a predetermined time interval which is greater than known durations exhibited by transient processing conditions; and outputting a signal if said timer exceeds the predetermined time interval.

The method preferably includes the step of automatically terminating the manufacturing process if the timer exceeds the predetermined time interval or at a minimum to alert a process operator if the timer generates said output signal.

The sensor capable of performing the sampling, (e.g. a mass spectrometer) preferably has a set of relays which are part of the timing circuit or alternately the sensor includes relay logic including a plurality of setpoints which can be separately triggered when at least one signal exceeds a preselected value, said method including the steps of:

identifying materials present in anomalous processing conditions; and preselecting the setpoints of said sensor in accordance with maximum levels of mass constituents corresponding to the identified materials.

Most preferably, the above timing step is initiated only upon the triggering of a predetermined combination of said setpoints. The above method has been demonstrated to be particularly effective in identifying the presence of photoresist in a vacuum deposition process.

An advantage of the present invention is that the inclusion of a timer circuit in combination with a sensor as described above allows the presence of normal processing steps, such as pressure bursts, to be discriminated against longer duration signals which are more likely to be indicative of contamination or other long-term conditions.

A further advantage is that the manufacturing tool is configured to receive input from the above circuit directly and to alert the operator of the processing apparatus if a predetermined condition is met.

These and other objects, features, and advantages will be readily apparent from the following Detailed Description which should be read in accordance with the accompanying drawings.

BRIEF DESCRIPTION OF THE DRAWINGS

FIGS. 5–9 are graphical data representations taken using the mass spectrometer of FIG. 2 in the buffer chamber of the manufacturing cluster tool of FIG. 1, illustrating ion current differences output over time during several different events in the tool, including degas processing, to detect the presence of residual photoresist and to discern between false negatives indicative of other operations in the tool.

DETAILED DESCRIPTION

Figure 1:
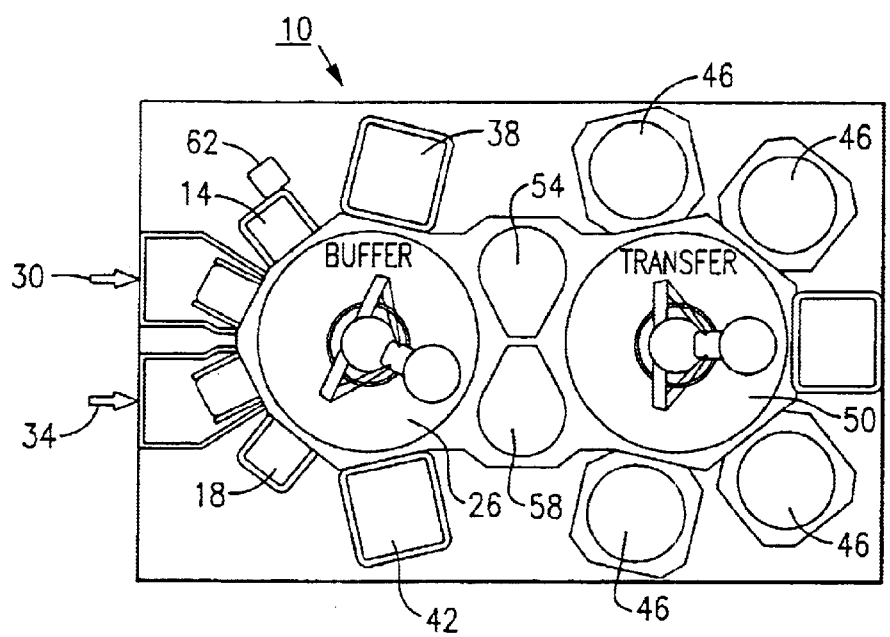
FIG. 1 is a block diagram of a typical semiconductor manufacturing processing tool.

Prior to describing the present invention, background information is herein provided in conjunction with FIG. 1 which illustrates the general configuration of a typical PVD (Physical Vapor Deposition) manufacturing tool 10. The chamber illustrated, for purposes of the following discussion, is an Endura 5500 PVD cluster tool manufactured by Applied Materials, Inc. The tool 10 is equipped with a pair of degas modules or chambers 14, 18. Typically, the above tool 10 includes a minimum of one and a maximum of two degas modules. The degas modules 14, 18 are attached to a buffer chamber 26, along with two load lock modules 30, 34 and a pair of sputter etch modules 38, 42.

There are typically four (4) wafer processing modules 46 which are connected to an adjacent transfer chamber 50. The buffer chamber 26 and transfer chamber 50 are separated from one another by a pair of cool/pass-through modules 54, 58, at least one of the pass-through modules being set up for rapid cooling of processed wafers and which employs several torr of argon or other suitable gas as a heat transfer medium.

Each of the degas modules 14, 18 have no pumps of their own. Furthermore, each of the above modules 14, 18 are also not isolated from the buffer chamber 26. As a result, whenever valves (not shown) are actuated to any other module connected to the buffer chamber 26, a gas burst is observed in the degas modules 14, 18. These bursts arise from the load lock modules 30, 34, which are only rough pumped, and from the cool/pass through modules 54, 58 which are not pumped before being opened to the buffer chamber 26. As detailed below in greater detail, these gas bursts, especially those bursts in which argon pressure is not often well controlled at a nominal value (e.g., two torr), are sufficient to cause a momentary or transient over pressure condition in an attached mass sensor. The duration of these pressure bursts is typically less than five seconds, however, the presence of the above bursts is sufficient to occasionally cause an over-pressure trip out condition of the apparatus.

In operation, the degassing within the degas modules 14, 18 is accomplished by illuminating the front surface of a retained wafer with intense light from a plurality of quartz/halogen bulbs (not shown). The duration of a typical degas process is typically on the order of approximately 10–200 seconds. Details regarding this portion of the operation are known to those of ordinary skill in the field and therefore require no further discussion. Due to complex algorithms utilized by the manufacturing tool 10 to maximize wafer throughput, there is no guaranteed temporal relationship between the interfering gas bursts and the degas cycle. That is to say, several different operations can be occurring simultaneously, in different chambers of the manufacturing tool 10.

A typical sequence of semiconductor wafer processing is as follows: First, the manufacturing tool 10 takes a wafer (not shown) from a cassette (also not shown) in one of the load lock modules 30, 34 and transfers the wafer into the buffer chamber 26, after which it is placed in one of the degas modules 14, 18. After orienting and degassing in the manner described above, the wafer is brought back into the buffer chamber 26 and is then inserted into one of the sputter etch modules 38, 42. Following this processing, the wafer is again sequentially transferred into the buffer chamber 26, into a cool/pass through module 54, 58, and then into the transfer module 50. The wafer is then placed into a succession of deposition and sputtering modules 46, after which the wafer is reinserted into one of the cool/pass-through module 54, 58, followed by the buffer chamber 26, and finally back into one of the load lock modules 30, 34 where the wafer is removed from the manufacturing tool 10. It should be pointed out that in a mass production setting several wafers are typically being processed simultaneously, and in an overlapping manner according to the above protocol, thereby adding to the overall complexity of the manufacturing process.

If a wafer is contaminated with residual photoresist from a preceding processing step, this contamination will also contaminate the manufacturing tool 10. Contamination of either degas module 14, 18 is a relatively minor problem, resulting in downtime of a few hours, since the base vacuum is typically in the E-07 torr range. Similar contamination of a process module, such as one of the sputtering and deposition module 46, however, would require extensive downtime in that a total wet clean would be required, along with replacement of the sputtering target, shields, and associated equipment. The extent of this downtime could be several days.

The most common photoresist problem occurs when a coated wafer is not completely ashed, i.e., some of the photoresist remains. This misprocessing is estimated to be about one thousand times more common than the situation in which the wafer is not ashed at all. Misprocessing of wafers happens frequently enough to be a significant impediment to fabrication throughout processing.

The embodiment described herein utilizes a residual gas analyzer (hereinafter referred to as an RGA) 62, FIG. 2, such as the TSP C100M quadrupole mass spectrometer manufactured by Leybold Inficon, Inc. It should be readily apparent that other suitable instruments can be substituted employing the concepts described herein. The above RGA 62, shown partially in FIG. 2, is described completely in the TRANSPECTOR Gas Analysis System Manual, published by Leybold Inficon, Inc. as revised March, 1997, which is incorporated by reference in its entirety.

Figure 2:
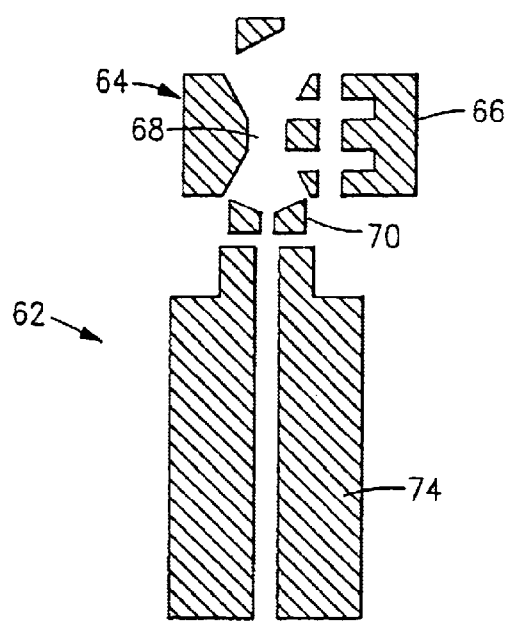
FIG. 2 is a partial schematic diagram of a mass spectrometer used in accordance with a preferred embodiment of the present invention.
Figure 2:
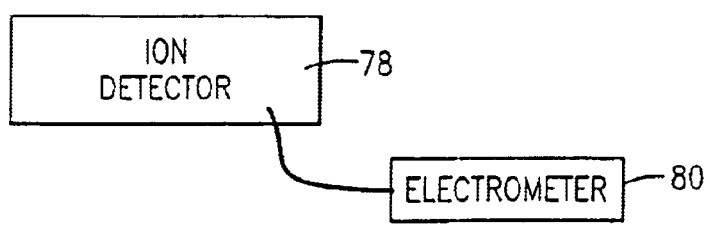

Referring to FIGS. 1 and 2, the RGA 62, is preferably installed through known means to either a port on the buffer chamber 26 or directly to one of the orient/degas modules 14, 18, of the semiconductor processing tool 10, all of which are pumped to high vacuum by a buffer cryo pump (not shown). According to the present embodiment, the mass spectrometer portion 64, shown in part schematically in FIG. 2, and the electronics portion (not shown) of the RGA 62 are installed on the wall of one of the degas module 14, using a 90 degree CF flange elbow (not shown) or other known means mounting thereon, preferably in a vertical position.

Figure 3:
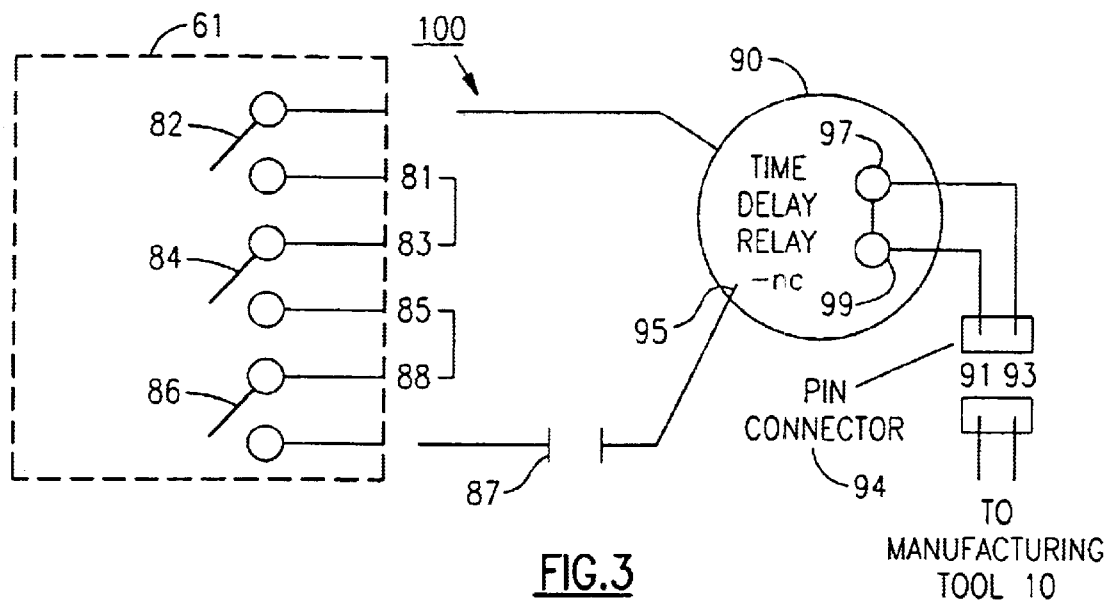
FIGS. 3 and 4 are portions of schematic diagrams of a timing circuit used between the manufacturing tool of FIG. 1 and the mass spectrometer of FIG. 2.

In brief and referring to FIG. 2, the mass spectrometer portion 64 of the RGA 62, FIG. 3, includes an ion source 66 including an electron emitter (not shown) which emits electrons that pass through an opening in an ionization chamber having an ionization volume 68 containing rarified gas. The electrons interact with the gas molecules, and ionize with some of the molecules. The ions which are produced are accelerated by a focus plate or ion lens assembly 70 through an opening into an ion beam which is focussed through a quadrupole mass filter 74. The mass filter 74 separates ions contained in the focussed ion beam (not shown) based on mass to charge ratios, permitting certain ions to pass therethrough onto an ion collector or detector 78, such as an electron multiplier, which is interconnected by known means to an electrometer 80. Additional details relating to the ion source, the ion detector, electrometer and the electronics portion of the RGA 62 are provided, for example, in the cross referenced TRANSPECTOR Manual referred to above and do not form a specific part of the present invention, except as indicated herein The electronics portion (not shown) includes software which allows representations, such as mass spectra and other graphical output, such as those illustrated in FIGS. 5–9, and described below based at least in part on masses which are selected to pass though the quadrupole mass filter 74.

Figure 4:
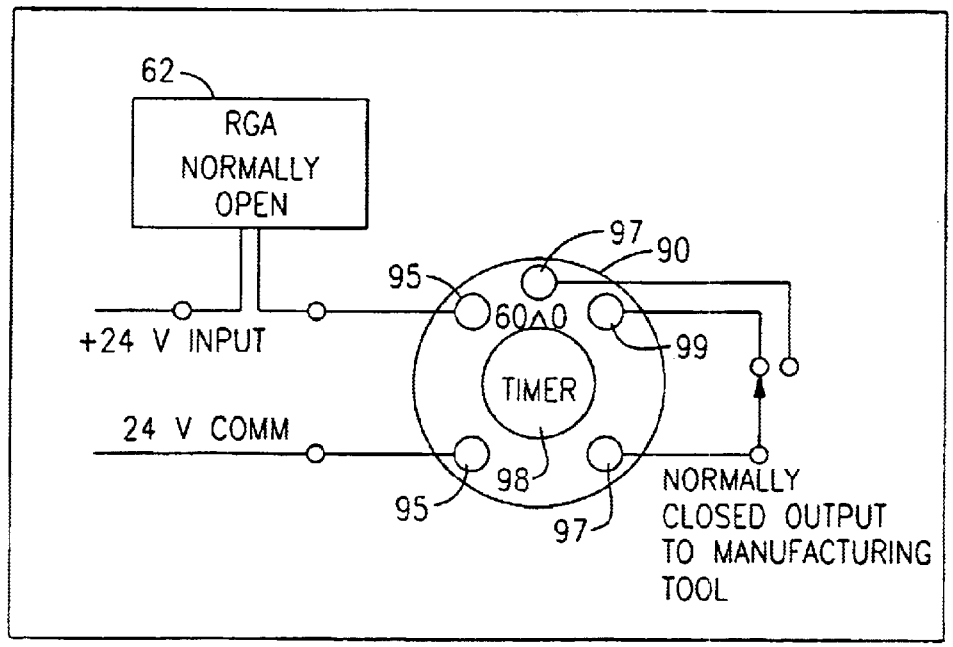
Figure 5:
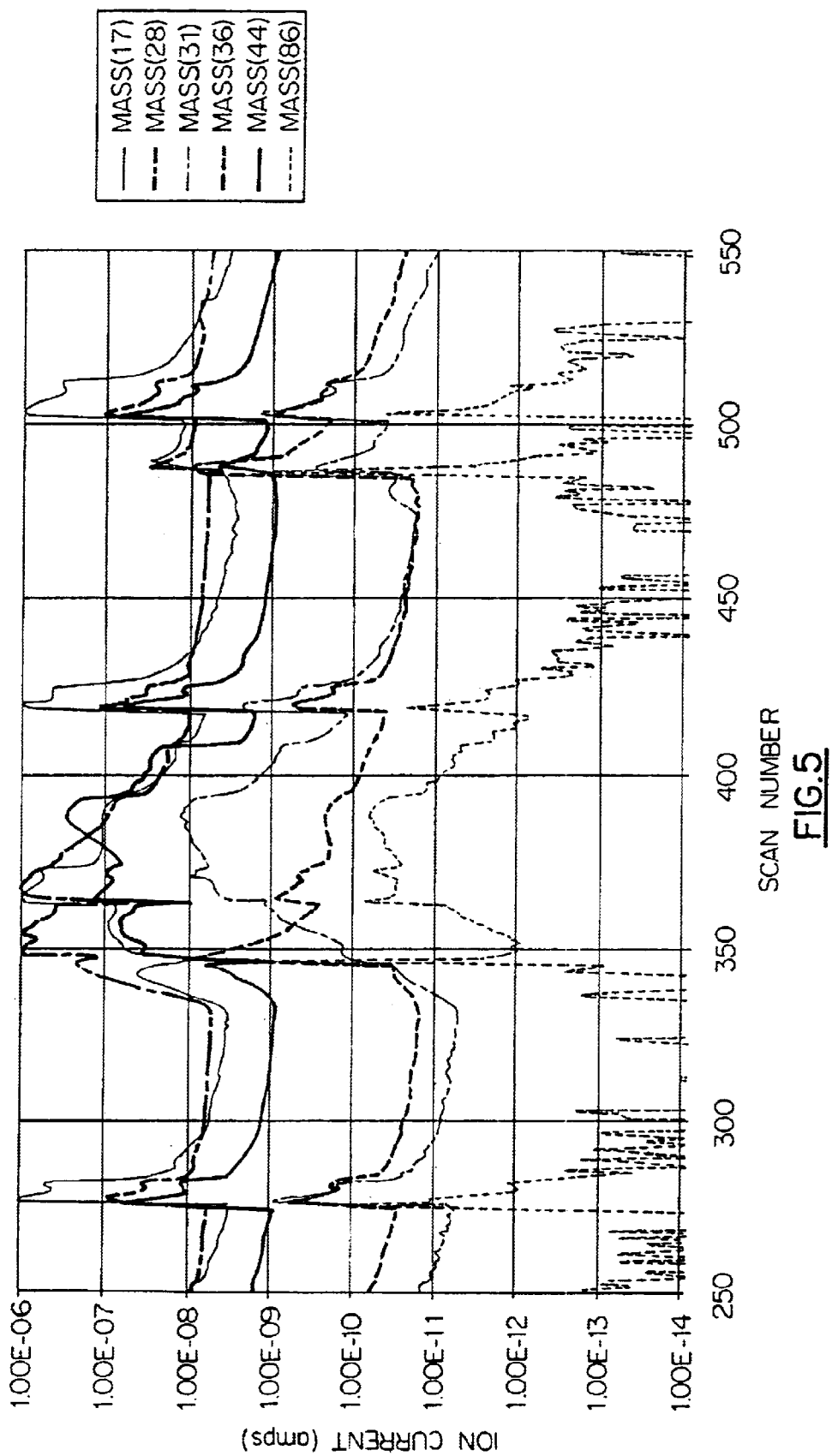
Figure 6:
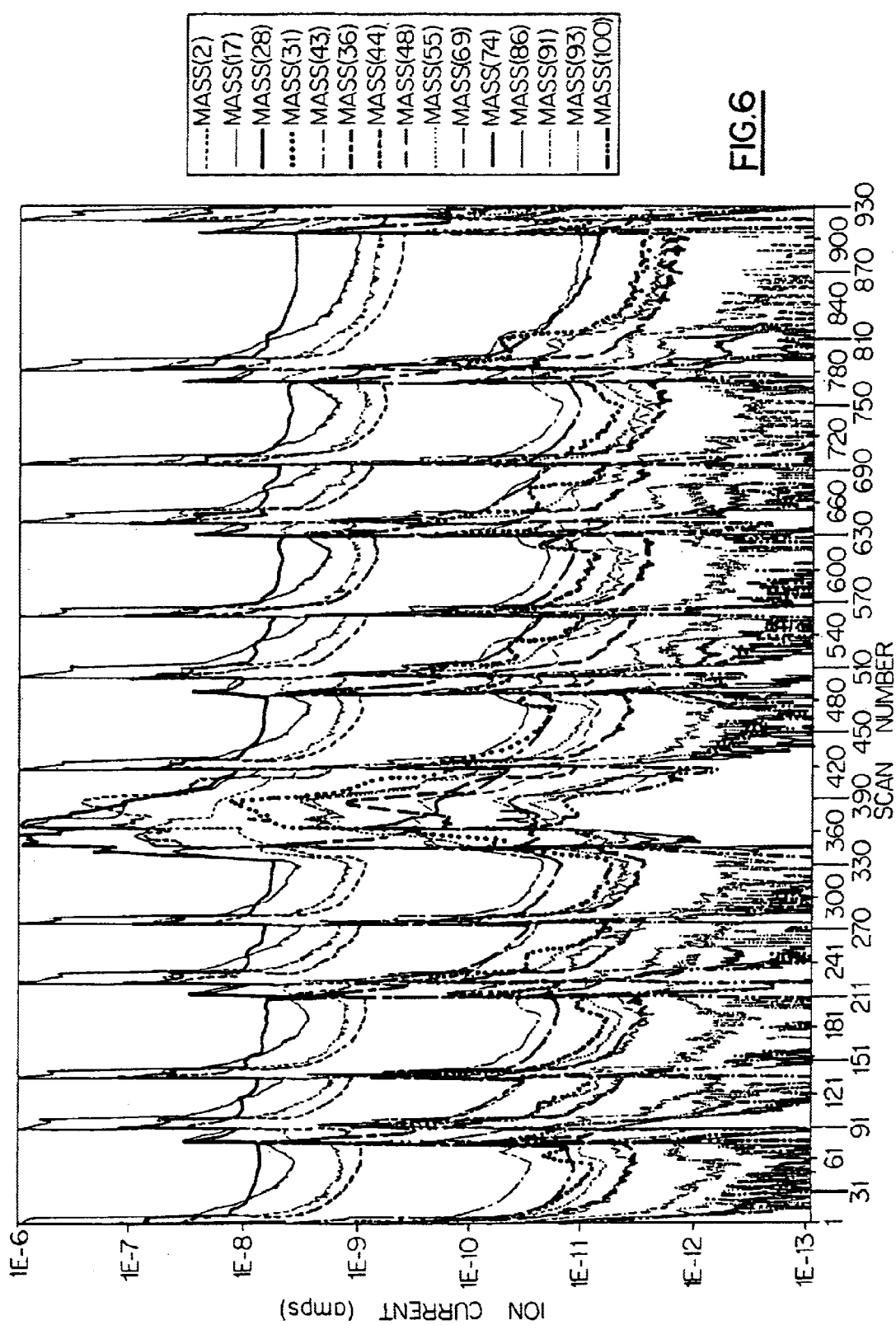
Figure 7:
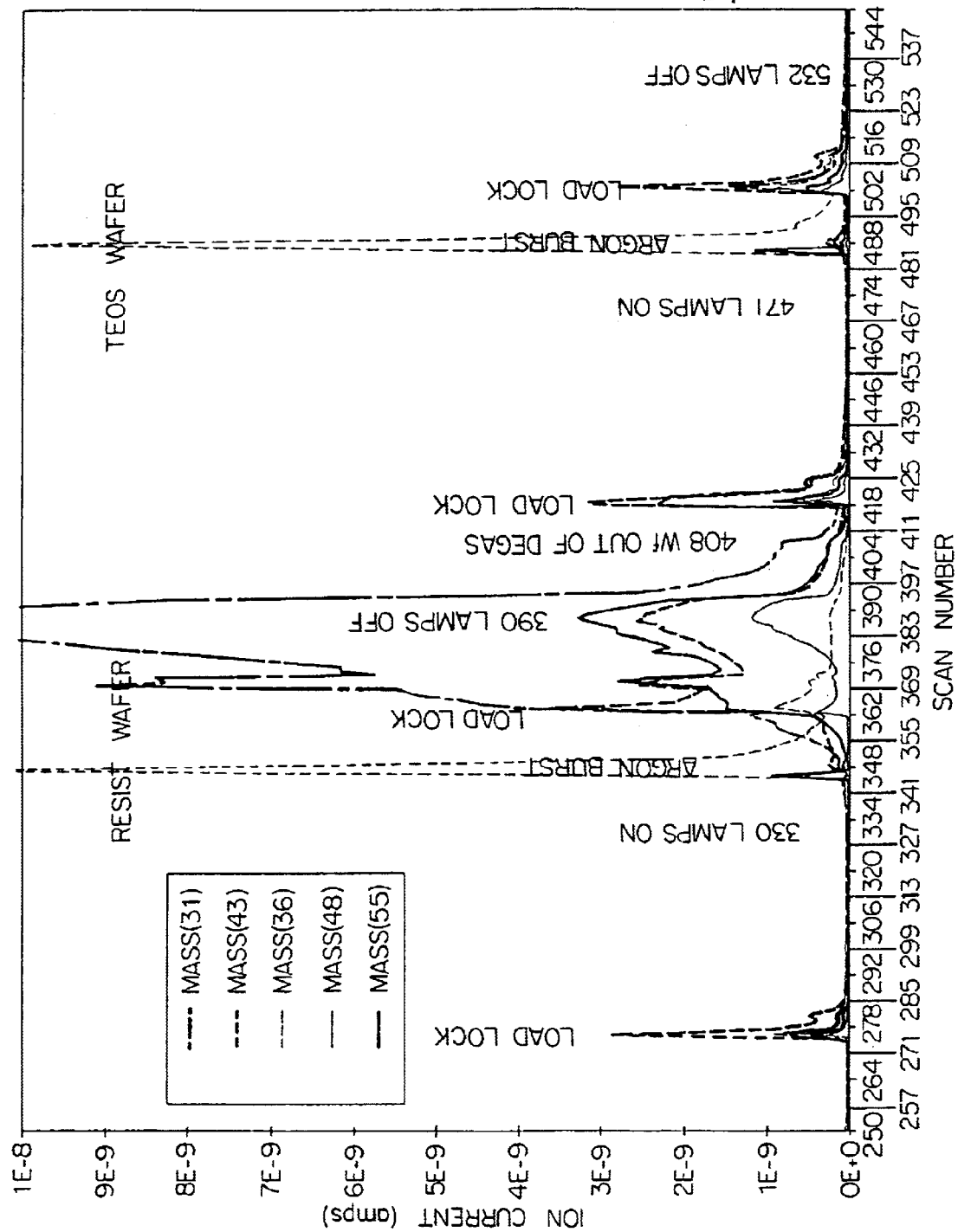
Figure 8:
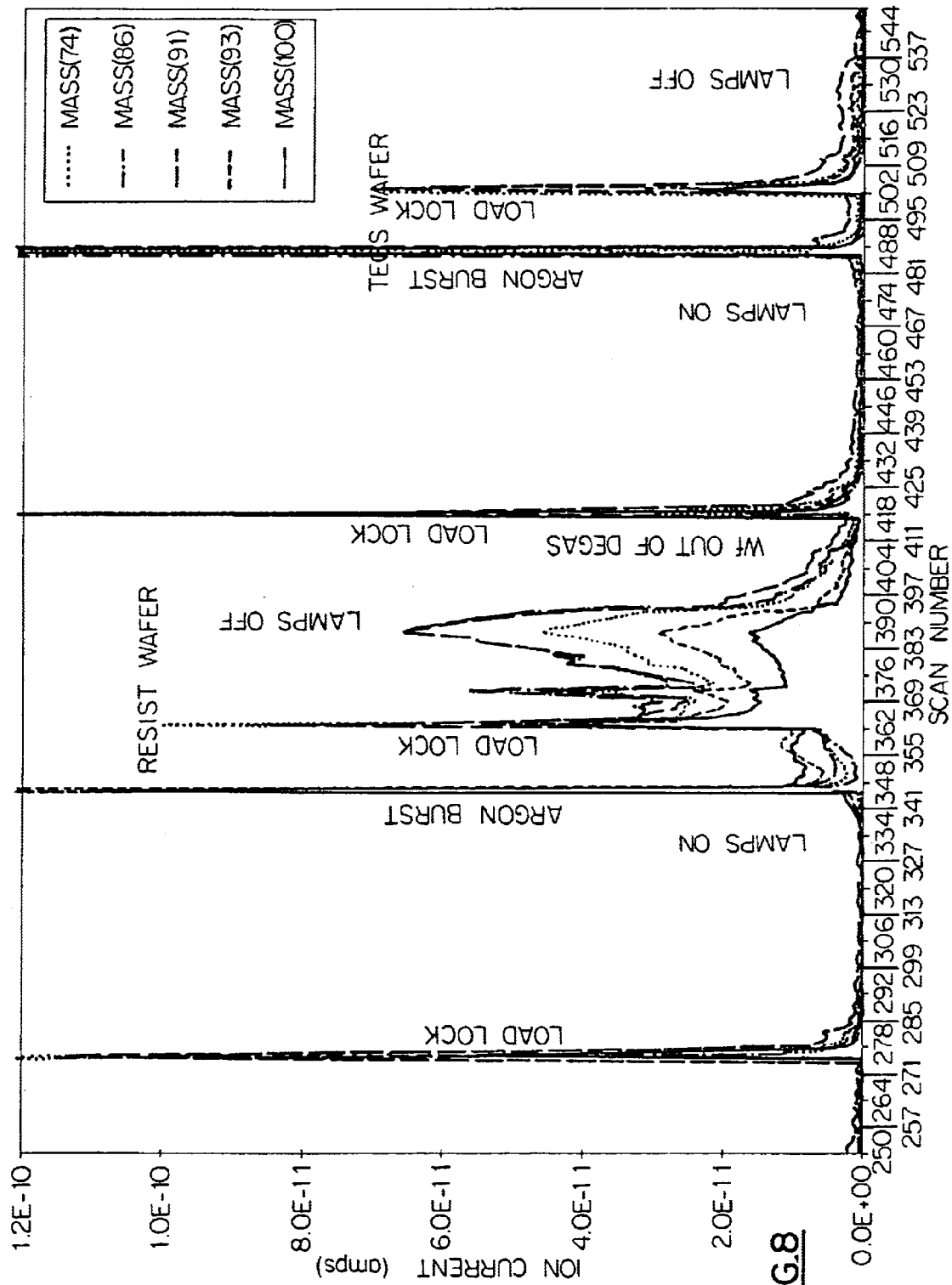

Referring to FIGS. 3 and 4, a timing circuit 100 is attached to the RGA 62. According to the present embodiment, the timing circuit 100 includes a number of electrical relays 82, 84, 86, each of which include a pair of selectable set points. In the present sensor device, three (3) electrical relays are provided, each having two set points to monitor output signals from the RGA 62. In this embodiment, a total of six (6) mass or AMU settings of the atmosphere within the manufacturing tool 10 are monitored, though it should be readily apparent that incorporation of additional or fewer relays is acceptable, depending on the application. Additionally, and though the present sensor includes individual relays 82, 84, 86, it should be readily apparent that the relay conditions can be similarly duplicated through other signal devices or through software having sufficiently programmable logic elements to mimic the relay settings.

A sample "recipe" is devised for certain identified masses which are suitably formed in photoresist pyrolysis. For purposes of the following chart, the following masses 15, 28, 31, 44, 64 and 86 AMU have been identified and are defined for the following example recipe chart which constitute the masses of ions characteristic for degassed I-line photoresist.

| AMU | Product Wafer | 20 Sec Ash | Trigger Set |
|---|---|---|---|
| 15(2) | 5.0 E-10 | 6.00 E-08 | 2.00 E-08 |
| 28(1) | 1.00 E-08 | 1.00 E-07 | 2.00 E-08 |
| 31(2) | 1.00 E-11 | 2.00 E-08 | 2.00 E-09 |
| 44(1) | 7.70 E-10 | 2.00 E-07 | 5.00 E-08 |
| 64(3) | 3-00 E-12 | 1.00 E-09 | 1.50 E-10 |
| 86(3) | 4.00 E-13 | 4.00 E-10 | 1.50 E-10 |

Each of the units shown are in amps and are defined ion current values with the number in parentheses representing the number relay which is set to the particular trigger point based on the empirical data of the product wafer and 20 sec ash columns. The outputs of each of the electrical relays 82, 84, and 86 are "added" together according to this embodiment by placing jumper wires in the I/O connector 61 (shown in phantom) of the RGA 62 as shown in FIGS. 3 and 4 through the connection of relay pin 81 to pin 83 and relay pin 85 to pin 88, as shown. That is, all three relays 82, 84, and 86 must be activated for proper photoresist detection. In series with the three relays 82, 84, 86 is a power supply 87 having sufficient voltage (in this instance +24 volts) to enable activation of a time delay relay 90 which is attached thereto. According to the present embodiment, the time delay relay 90 is a C10 Series TDR sold by the Amerpite corporation or other commercially available relay of an equivalent type.

An algebraic Boolean expression is therefore derived for use with the three relays 82, 84, 86 as follows:

$$E=([28] \text{ OR } [44]) \text{ AND } ([15] \text{ OR } [31]) \text{ AND } ([64] \text{ OR } [86])$$

in which the bracketed values indicate those masses specified in the preceding chart. The bracketed values are represented by the set points in which binary logic dictates; that is either 1 or 0, whether the ion currents measured exceed the programmed set points.

According to the present embodiment, and when all three relays 82, 84, 86 are tripped; that is, the above Boolean expression is satisfied, +24 volts from the power supply 87 is placed on the input pins 95 of the time delay relay 90. The application of voltage from the power supply 87 starts an adjustable timer 98 set for a predetermined interval. According to the present embodiment, the timer 98 is set for approximately 6 seconds. After this interval has been exceeded, the timer delay relay 90 will trip automatically, sending an appropriate signal as input to the manufacturing tool 10 to cause shutdown or, at a minimum, will trigger an audible or other suitable alarm (not shown), thereby indicating the presence of photoresist.

More specifically, the present manufacturing tool 10 requires an open circuit for error detection. Therefore, the connection of the manufacturing tool 10 is wired to the normally closed pins 97, 99 of the time delay relay 90. A multi-pin connector 94 is used to connect the time delay relay 90 to the manufacturing tool 10, shown schematically in FIG. 4, with pins 91, 93 being used to make the connection to the multi-pin connector 94 according to the present embodiment.

Preferably, depending on the recipe and masses selected, the described RGA 62 is able to detect the presence of either I-line or DUV (Deep Ultra Violet) residual photoresist during the degas process, and therefore positively identify the presence of contamination upon a degassed wafer by monitoring different signals which are specific to photoresist pyrolysis and employing a method that ignores brief high pressure events which produce false detection. Preferably, the contamination signal is fed directly into the manufacturing tool 10 to halt further process, to allow rework of the contaminated wafer, and to assure that no contamination is spread to deposition modules.

In summary, as to this embodiment, and by monitoring the intensities of specified masses (depending on the type of photoresist present) and setting alarm thresholds with logical OR-ing and AND-ing of the relay outputs using the above or other suitable Boolean expression, along with a predetermined timer delay (in this instance approximately six (6) seconds), it is possible to detect the presence of photoresist with a high degree of accuracy and without false indications.

Reference is now made to FIGS. 5–9 which illustrates graphical representations as measured by the RGA 62, as attached to one of the degas modules 14, FIG. 1. Each of FIGS. 5–9 are defined along the x-axis by a series of chronological scan numbers presenting a timed sequence as read from left to right. The y-axis of each graph indicates ion current, measured in amps by the detector portion of the mass spectrometer and illustrated in specified ranges between FIGS. in order to clearly illustrate the effectiveness of the present invention. For purposes of the discussion which follows, it should be noted that each scan number represents approximately $2/3$ of a second.

In the present example, the characteristics of degas processing of two different wafers are monitored and compared. As most clearly shown in FIG. 7, the degas operations are for a partially ashed wafer (commencing at scan number 330 and ending at scan number 390) and a test wafer (labeled TEOS) having no photoresist present (commencing at scan number 471 and ending at scan number 532).

By sensitizing the mass spectrometer for particular mass to charge ratios, specific masses can be easily targeted. Each of the degas procedures shown are approximately 40 in duration, though as noted above these periods can range between 10–200 seconds. Specific mass settings are selected in each of the above graphs to illustrate comparatively the occurrence of other events in the manufacturing tool affecting the measured output, such as opening of either of the load lock modules or a cool argon burst are much shorter in duration than the degas process. On average, each of the preceding events occur over less than 6 scan numbers, or less than about 4 seconds.

As clearly discernible from FIGS. 5–9, each of the non-degas producing events will cause increases in the measured ion current, which, depending on the masses selected and shown by the appropriate legends of each chart, which are in excess of a predetermined trigger value. However, because the signal is not sustained for a sufficient duration (less than 6 seconds), the timer relay 90 does not send a signal to the manufacturing tool 10. Note that a load lock and a argon blast event occurs during each of the above degas processes, but that only the scan portion between about 360 and 390 has voltage values for an adequate time duration sufficient for triggering. As most clearly observed from FIG. 6, and without the use of the above timer circuit, it would not be possible to use a mass spectrometer with the tool 10 using appropriate ion current limits without the regular occurrence of false indications.

Though the present embodiment utilizes a timer relay which is separately utilized with the electrical relays of the described mass spectrometer, alternate embodiments can include modifications to the logic of the software of the mass spectrometer to incorporate the above relay Boolean logic (OR-ing and AND-ing) into timer functions. Preferably, firmware between the manufacturing tool and the mass spectrometer can also be modified to detect the presence of residual photoresist, in the event of computer failure.

In addition, and though the above embodiment relates specifically to the detection of photoresist without false negatives, it should be readily apparent to one of sufficient skill in the field that additional binary variables corresponding to a particular parameter or state of the processing tool, or any other processing variable in a two-state format (e.g., plasma power above or below a predetermined limit, the presence of absence of a wafer in a specified processing module, degas module lamp power being above or below a pre-specified value, the opening and closing of slit-valves, etc.) can be utilized into a Boolean algebraic expression. The value of the output variable of the Boolean algebraic expression selected can then be used to determine whether additional processing should be attempted. As in the preceding, this determination can be made automatically (via a direct electrical input to the manufacturing tool or through a computer interface to the mass spectrometer and the tool) or by a human operator.

PARTS LIST FOR FIGS. 1–9

10 cluster tool
14 degas module
18 degas module
26 buffer chamber
30 load lock module
34 load lock module
38 etch module
42 etch module
46 wafer processing modules
50 transfer chamber
54 pass-through module
58 pass-through module
61 I/O connector
62 residual gas analyzer (RGA)
66 ion source
70 lens assembly
74 quadrupole mass filter
78 ion detector
80 electrometer
81 relay pin
82 relay
83 relay pin
84 relay
85 relay pin
86 relay
87 power supply
88 relay pin
90 timer delay relay
91 pin
92 jumper cables
93 pin
94 connector
95 input pins
97 pin
98 timer
99 pin
100 timer circuit

We claim:

1. Processing apparatus for determining the presence of aberrant conditions in a manufacturing process, said apparatus comprising:
   a manufacturing tool having an interior within which said manufacturing process is performed and control means for controlling said manufacturing process; and
   a sensor in communication with the interior of said manufacturing tool, said sensor having means for determining mass constituents of at least one sampled gas created during said manufacturing process and producing signals indicative of the intensities of said constituents, said sensor further including means for detecting when signals produced by said sensor has exceeded a predetermined value for a predetermined duration.

2. Apparatus as claimed in claim 1, wherein said detecting means includes a timing circuit including a timer which is activated only upon detection of signals by said sensor which exceed the predetermined value.

3. Apparatus as claimed in claim 2, wherein said timing circuit includes means for sending an output signal to said manufacturing tool if said timer exceeds said predetermined duration.

4. Apparatus as claimed in claim 3, wherein said timing circuit is connected to said control means and said output signal generated by said timing circuit causes said control means to terminate the manufacturing process.

5. Apparatus as claimed in claim 3, wherein the time duration of said timer is greater than the known time duration of transient processing effects produced within the manufacturing tool such that the output signal generated by said timing circuit effectively screens the transient processing effects.

6. Apparatus as recited in claim 2, wherein said sensor is a mass spectrometer having means for producing and detecting ions having specified mass to charge ratios, said detecting means being capable of detecting representative signals of said specified ions, said sensor further including a plurality of relays, each relay having at least one setpoint which is triggered when at least one specified ion signal has exceeded a predetermined intensity.

7. Apparatus as claimed in claim 6, wherein only the triggering of setpoints of certain preselected relays produces an output signal which is transmitted to said timing circuit for activating said timer.

8. Processing apparatus for determining the presence of anomalous conditions in a semiconductor substrate manufacturing process, said apparatus comprising:
   a manufacturing tool having an interior including a plurality of chambers within which said semiconductor substrate manufacturing process is performed and control means for controlling said manufacturing process; and
   at least one sensor in communication with the interior of said manufacturing tool, said sensor being a mass spectrometer having means for determining mass constituents of at least one sampled gas created during said manufacturing process and producing representative signals indicative thereof, said sensor further including means for detecting signals produced by said sensor which have exceeded a predetermined value including a timer which is activated only upon detection of signals exceeding the predetermined value.

9. Apparatus as claimed in claim 8, wherein said timer is electrically interconnected to said manufacturing tool so as to transmit an output signal only when said timer exceeds a preselected time duration.

10. Apparatus as claimed in claim 9, wherein said timer is interconnected to said control means to terminate the manufacturing process if the output signal is generated by said timer.

11. Apparatus as claimed in claim 10, wherein each relay setpoint is configured to a specified mass constituent signal.

12. Apparatus as claimed in claim 8, including a plurality of relays, each relay having at least one set point which is triggered based on the levels of selected mass constituent signals received by said sensor from the interior of said manufacturing tool, wherein only the triggering of the set points of a preselected number of said relays causes activation of said timer.

13. Apparatus as claimed in claim 8, wherein said timer is set to a time duration which is greater than a known time period indicative of transient processing conditions within the interior of the manufacturing tool so as to discriminate the transient effects from anomalous conditions.

* * * * *